(12) United States Patent
Shenoy

(10) Patent No.: US 6,271,711 B1
(45) Date of Patent: Aug. 7, 2001

(54) SUPPLY INDEPENDENT BIASING SCHEME

(75) Inventor: Ravindra U. Shenoy, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/387,448

(22) Filed: Sep. 1, 1999

(51) Int. Cl.[7] ....................................................... G05F 1/10
(52) U.S. Cl. ............................................. 327/530; 323/312
(58) Field of Search ................................. 327/530, 538, 327/542, 543, 415, 416, 417, 545; 323/312, 315

(56) References Cited

U.S. PATENT DOCUMENTS

| | | | | |
|---|---|---|---|---|
| 5,349,287 | * | 9/1994 | Lorenz | 323/315 |
| 5,410,241 | * | 4/1995 | Cecil | 323/315 |
| 6,002,245 | * | 12/1999 | Sauer | 323/315 |

* cited by examiner

Primary Examiner—Jung Ho Kim

(57) ABSTRACT

A system and method for a supply-independent VCO biasing scheme for generating bias voltages and currents for a VCO of a phase-locked loop are disclosed A biasing scheme for generating a bias electrical signal comprises a first and second current source coupled to a power supply, a current drain coupled to the second current source and to ground, a replica device having a first node, a second node coupled to the second current source and the current drain, and a third node coupled to ground, and a first and second current splitting device having first nodes coupled to each other and to the current source and having third nodes coupled to the first and second nodes of the replica device, respectively.

17 Claims, 4 Drawing Sheets

SUPPLY INDEPENDENT BIASING SCHEME

BACKGROUND OF THE INVENTION

1. Field of the Invention

The present invention relates generally to an oscillator biasing scheme in a phase-locked loop. More specifically, a supply independent oscillator biasing scheme for generating bias voltages and currents for an oscillator of a phase-locked loop is disclosed.

2. Description of Related Art

A phase-locked loop (PLL) generally comprises a phase detector, a low-pass loop filter, and a voltage-controlled oscillator (VCO). The VCO is an oscillator that produces a periodic wave form as an output signal, the frequency of which may be varied about some free-running frequency depending upon the value of the applied voltage. The free-running frequency is the frequency of the oscillator signal or the VCO output when the applied voltage is 0.

The phase detector receives an incoming signal and the output signal of the VCO and produces a phase detector output signal. The phase detector output signal represents the phase difference between the incoming and oscillator signals. The phase detector output signal is filtered through the low pass filter. The output of the low pass filter is the output of the PLL and the applied voltage to the VCO used to change the frequency of the VCO output. The closed-loop operation of the circuit maintains the VCO frequency locked to that of the incoming signal frequency.

If the applied signal of the VCO has the free-running frequency as an initial frequency, the PLL will acquire lock and the VCO will track the incoming signal frequency over some range, provided that the incoming signal frequency changes slowly. However, the loop will remain locked only over some finite range of frequency shift.

When the loop is operating in lock, the incoming signal and the VCO output signal fed to the phase comparator are of the same frequency. When the loop is trying to achieve lock, the output of the phase comparator contains frequency components at the sum and difference of the signals compared. The low-pass filter passes only the lower frequency component of the signals so that loop can obtain lock between incoming and VCO signals.

During lock, the output of the low-pass filter is the value needed to hold the VCO in lock with the incoming signal. The VCO then outputs a fixed amplitude wave signal at the frequency of the incoming signal. A fixed phase difference between the incoming and the VCO output signals to the phase comparator results in a fixed applied voltage to the VCO. Changes in the incoming signal frequency then results in change in the applied voltage to the VCO.

The limited operating range of the VCO and the feedback connection of the PLL circuit results in two frequency bands specified for a PLL: a capture range and a lock range. The capture range of the PLL is the frequency range centered about the VCO free-running frequency over which the loop can acquire lock with the input signal. The lock range of the PLL is generally wider than the capture range and is the range over which the PLL can maintain lock with the incoming signal once the PLL achieves capture. Within the capture-and-lock frequency ranges, the applied voltage drives the VCO frequency to match that of the incoming signal.

A PLL can be used in a wide variety of applications, including (1) modems, telemetry receivers and transmitters, tone decoders, AM detectors, and tracking filters; (2) demodulation of two data transmission or carrier frequencies in digital-data transmission used in frequency-shift keying (FSK) operation; (3) frequency synthesizers that provide multiples of a reference signal frequency (e.g. the carrier for the multiple channels of the citizen's band (CB) unit or marine-radio-band unit can be generated using a single-crystal-controlled frequency and its multiples generated using a PLL); and (4) FM demodulation networks for FM operation with excellent linearity between the input signal frequency and the PLL output voltage.

One example of a VCO implementation is a multiple-stage differential ring oscillator constructed using identical delay stages. Because each of the multiple stages are identical in construction, the delay of each stage is assumed to be the same. In such a differential ring design, the frequency of the VCO output signal is 1(2×number of stages×the delay of each stage). Thus, the frequency of the VCO output signal is 1/(8×the delay of each stage) for a four-stage differential ring oscillator.

The performance of the PLL is dependent in part upon the time required for the VCO to acquire lock. The acquisition time is in turn dependent upon the phase difference between the incoming and VCO output signals. Reducing the range of the initial phase error uncertainty in the VCO output signal thus reduces the acquisition time.

Each delay stage of the VCO generally includes various biasing currents and reference voltages. These biasing currents and reference voltages may be generated by a VCO biasing scheme or biasing block. Since the loop filter of the PLL controls the VCO frequency through the bias block, the bandwidth of the biasing scheme is preferably sufficiently wide to minimize any additional delay. Such additional delay would manifest as a higher order pole in the loop transfer function. The wide bandwidth also facilitates fast acquisition of the incoming signal. Further, to achieve low supply voltage operation, the delay cell current sources and sinks are generally implemented with metal-oxide semiconductor ("MOS") devices. To improve the high frequency power supply rejection of the VCO, the parasitic capacitances of these delay cell current source/sink MOS devices are typically minimized by constructing these MOS devices with short channel lengths.

However, providing short channel lengths reduces the output impedance of these delay cell current source/sink MOS devices. Such reduction in the output impedance degrades the immunity of the VCO to static power supply variations. In conventional PLL's and VCO's, a replica biasing scheme is sometimes utilized to overcome this potential trade-off. However, the replica biasing scheme typically does not possess the wide-bandwidth critical in fast acquisition of the incoming signal.

Thus, it is desirable to provide a VCO biasing scheme which ensures that the delay cell and thus the VCO frequency are immune to variations in the supply voltage. It is further desirable to provide a biasing scheme having a wide bandwidth.

SUMMARY OF THE INVENTION

A system and method for a supply-independent VCO biasing scheme for generating bias voltages and currents for a VCO of a phase-locked loop are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

In a preferred embodiment, a biasing scheme for generating a bias electrical signal comprises a first and second current source coupled to a power supply, a current drain coupled to the second current source and to ground, a replica device having a first node, a second node coupled to the second current source and the current drain, and a third node coupled to ground, and a first and second current splitting device having first nodes coupled to each other and to the current source and having third nodes coupled to the first and second nodes of the replica device, respectively.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF SPECIFIC EMBODIMENTS

A system and method for a supply-independent VCO biasing scheme for generating bias voltages and currents for a VCO of a phase-locked loop are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
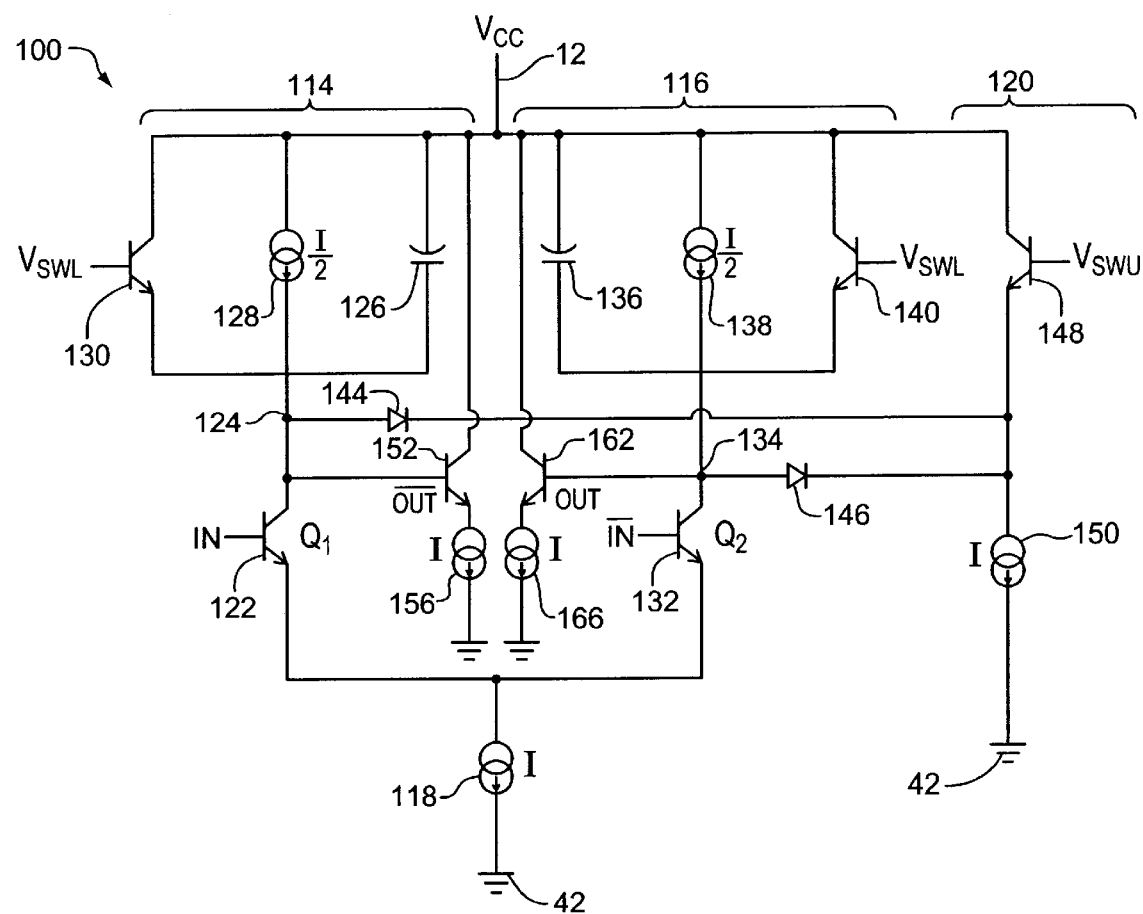
FIG. 1 is a circuit diagram of an exemplary delay cell of a VCO.

FIG. 1 is a circuit diagram of an exemplary delay stage or cell 100 of a VCO. The delay circuit 100 is similar to the delay circuit disclosed in co-pending U.S. Ser. No. 09/354,685 entitled "Double-Clamped Delay Stage And Voltage Controlled Oscillator" filed on Jul. 15, 1999, the entirety of which is incorporated by reference herein. The delay circuit 100 comprises a first branch 114, a second branch 116, and a tail current source 118. The tail current source 118 is coupled between ground 42 and the first and second branches 114, 116. The delay circuit 100 may further comprise a third branch 120.

The first branch 114 includes a first input receiver 122 for receiving a first input IN to control a first current on the first branch 114. The first branch 114 has a first clamped node 124. The first branch 114 further includes a first timing capacitor 126, a first current source 128, and a first lower limit clamp 130, each of which is coupled between the power supply 12 and the first clamped node 124.

The second branch 116 includes a second input receiver 132 for receiving a second input $\overline{IN}$ to control a second current on the second branch 116. The second branch 116 has a second clamped node 134. The second branch 116 further includes a second timing capacitor 136, a second current source 138, and a second lower limit clamp 140, each of which is coupled between the power supply 12 and the second clamped node 134.

The delay circuit 100 further comprises a first current diverter or diode 144 coupled to the first branch 114 at the first clamped node 124 for diverting current on the first branch 114 away from the first input receiver 122, and a second current diverter or diode 146 coupled to the second branch 116 at the second clamped node 134 for diverting current on the second branch 116 away from the second input receiver 132. The first and second current diverters 144, 146 are coupled to the third branch 120. The third branch 120 may comprise an upper limit clamp 148 coupled between the power supply 12 and the first and second current diverters 144, 146, and an upper clamp current source 150 coupled between ground 42 and the first and second current diverters 144, 146.

Each of the first and second branches 114, 116 of the delay circuit 100 further comprises an output emitter follower circuit shown. The output emitter follower circuit of the first branch 114 includes a first output transistor 152 coupled between the power supply 12 and a first output node 154 at which the first output $\overline{OUT}$ is taken. The first clamped node 124 is coupled to the base of the first output transistor 152. The output emitter follower circuit of the first branch 114 further includes a first output current source 156 coupled between the first output node 154 and ground 42.

Similarly, the output emitter follower circuit of the second branch 116 includes a second output transistor 162 coupled between the power supply 12 and a second output node 164 at which the first output OUT is taken. The second clamped node 134 is coupled to the base of the second output transistor 162. The output emitter follower circuit of the second branch 116 further includes a second output current source 166 coupled between the first output node 154 and ground 42.

Each of the first and second input receivers 122, 132, the first and second lower limit clamps 130, 140, the upper limit clamp 148, and the first and second output transistors 152, 162 is preferably a bipolar junction transistor ("BJT"). Preferably, the bipolar junction transistors for the first and second input receivers 122, 132 and the transistor 34 are of generally identical construct. Similarly, the bipolar junction transistors for the first and second lower limit clamps 130, 140 are preferably of generally identical construct. Further, the bipolar junction transistors for the first and second output transistors 152, 162 are preferably of generally identical construct.

A voltage swing low input of VSWL may be applied to each of the first and second lower limit clamps 130, 140 and a voltage swing high input of VSWU may be applied to the upper limit clamp 148. Each of the first and second lower limit clamps 130, 140 having input VSWL serves to maintain or limits the voltage at the first and second clamped nodes 124, 134 from dropping below a minimum or a lower limit threshold voltage $V_{MIN}$. The upper limit clamp 148 having input VSWU serves to maintain or limit the voltages at the first and second clamped nodes 124, 134, respectively, to a maximum or an upper limit voltage $V_{MAX}$. In other words, each of the first and second lower limit clamps 130, 140 having input VSWL serves to clamp the voltage at nodes 124, 134, respectively, to a minimum voltage $V_{MIN}$ while the upper limit clamp 148 having input VSWU serves to clamp the voltage at nodes 124, 134 to a maximum voltage $V_{MAX}$.

Each of the control, tail and upper clamp current sources 26, 118, 150 preferably has a current of amplitude I while each of the first and second current sources 128, 138 preferably has a current of amplitude I/2, i.e. one-half the current of each of the control, tail, and upper clamp current sources 26, 118, 150. The first and second current sources 128, 138 serve to charge the first and second timing capacitors 126, 136, respectively. The first and second output current sources 156, 166 preferably also has a current I.

Figure 2:
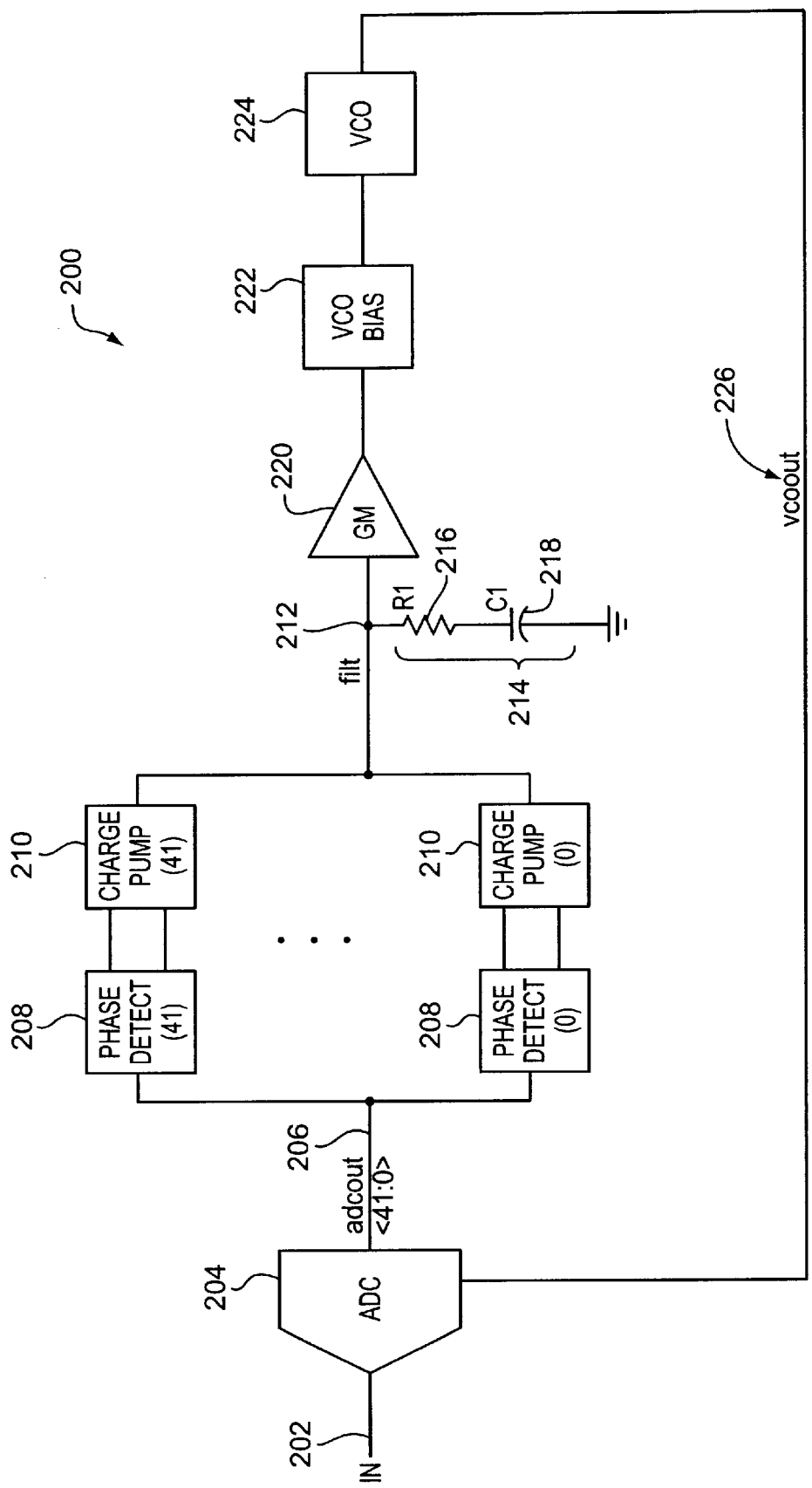
FIG. 2 is a schematic of a timing recovery using a modified second order PLL.

FIG. 2 is a schematic of a portion 200 of a timing recovery loop using a modified second order PLL. Incoming signal 202 is quantized by an analog-to-digital converter ("ADC") 204 into one of, for example, forty-two (42) unique levels or outputs 206. Each of the outputs 206 of the ADC 204 controls a loop filter 214 through a corresponding phase detector 208 each followed by a charge pump 210. Each phase detector 208 detects the phase difference between the incoming signal 202 and output VCOOUT 226 of a VCO 224. The charge pump 210 is a circuit block that serves as a source or sink of charge for the loop filter 214. in a typical implementation of a charge pump 210, two current sources, each in series with a switch are connected to a loop filter node 212. The switches of the charge pump 210 are typically controlled by the corresponding phase detector 208, which are updated to synchronize the output VCOOUT 226 of the VCO 224 to the incoming signal 202.

The phase difference information detected by the phase detector 208 is stored on the loop filter 214. The loop filter 214 includes a resistor 216 and a capacitor 218. The loop filter 214 serves to integrate the phase difference information on the voltage node 212 which drives the VCO 224 to attain phase and frequency synchronization with the incoming signal 202. As the VCO 224 is an integrator, the loop filter 214 adds a zero in the transfer function such that the overall loop is stable 200. Synchronization of the VCO 224 is achieved by using the output VCOOUT 226 of the VCO 224 to clock the ADC 204.

Between the VCO 224 and the loop filter 214 are a transconductor Gm 220 and a VCO bias block 222. The transconductor 220 sets the control gain of the VCO 224 with respect to the voltage at the loop filter node 212, with units [Hz/Volt]. The VCO bias block 222 generates the appropriate bias voltages and currents for the VCO 224.

As noted above, the VCO 224 is optionally a multiple-stage differential ring oscillator constructed using identical delay stages, such as a four-stage differential ring oscillator. Each of the identical delay stages of the VCO 224 is optionally the delay stage 100 as shown and described with reference to FIG. 1.

Figure 3:
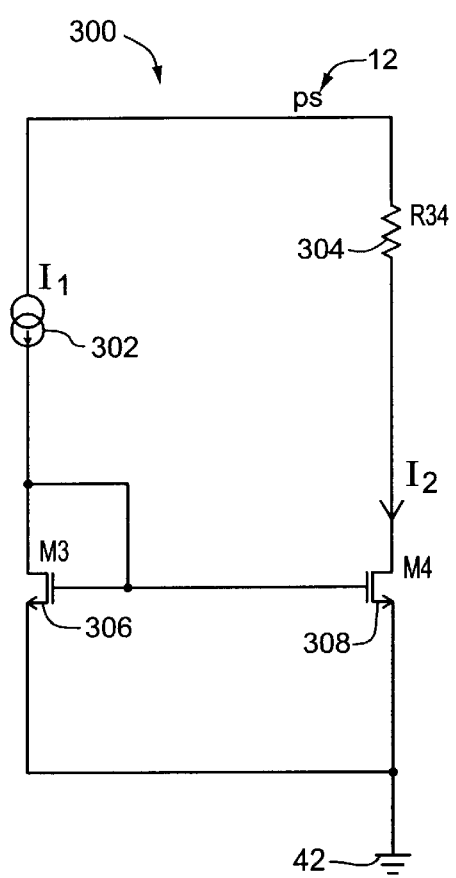
FIG. 3 is a circuit diagram of a conventional current mirror biasing scheme.

FIG. 3 is a circuit diagram of a conventional current mirror biasing scheme 300. The current mirror biasing scheme 300 generally comprises a current source 302 and a resistor 304 coupled to the power supply 12, first and second NMOS transistors 306, 308 with source nodes coupled to ground 42. The gates of the first and second NMOS transistors 306, 308 are coupled to each other as well as to the drain of the first NMOS transistor 306 and the current source 302. The drain of the second NMOS transistor 308 is coupled to the resistor 304.

The current through the second NMOS transistor 308 generally replicates that of the current source 302. However, variations in the voltage of the power supply 12 causes the drain to source voltage of the second NMOS transistor 308 to vary, thereby varying the current therethrough. Thus, variations in the voltage of the power supply 12 undesirably modulates the current through the second NMOS transistor 308.

Figure 4:
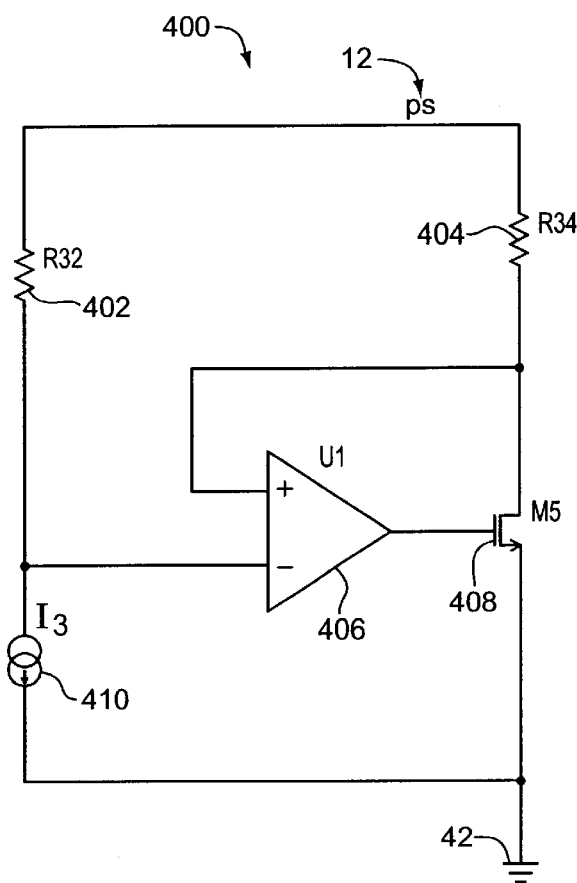
FIG. 4 is a circuit diagram of another conventional biasing scheme utilizing an amplifier.

FIG. 4 is a circuit diagram of another conventional biasing scheme 400, an improvement over that shown in FIG. 3. The biasing scheme 400 generally includes first and second resistors 402, 404 coupled to the power supply 12, an amplifier 406, an NMOS transistor 408, and a current sink 410 coupled to ground 42. The drain of the NMOS transistor 408 is coupled to the second resistor 404 and to a "+"input of the amplifier 406. The first resistor 402 is coupled to a "−" input of the amplifier 406 and to the current sink 410. An output of the amplifier 406 drives the gate of the NMOS transistor 408.

By receiving input voltages from the first and second resistors 402, 404, the amplifier 406 of the biasing scheme 400 regulates the current in the NMOS transistor 408 to be the same as the current through the current sink 410. Since the input voltages of the amplifier 406 both vary with respect to variations in the power supply 12, power supply variations are compensated. However, the stability constraints of the amplifier 406 limits the bandwidth of the biasing scheme 400 in responding to changes in the current sink 410.

Thus, as is evident with the discussions of the conventional biasing schemes 300, 400 as shown in FIGS. 3 and 4, respectively, a biasing scheme that provides a stable, supply independent biasing scheme with wide bandwidth and fast response is desired.

Figure 5:
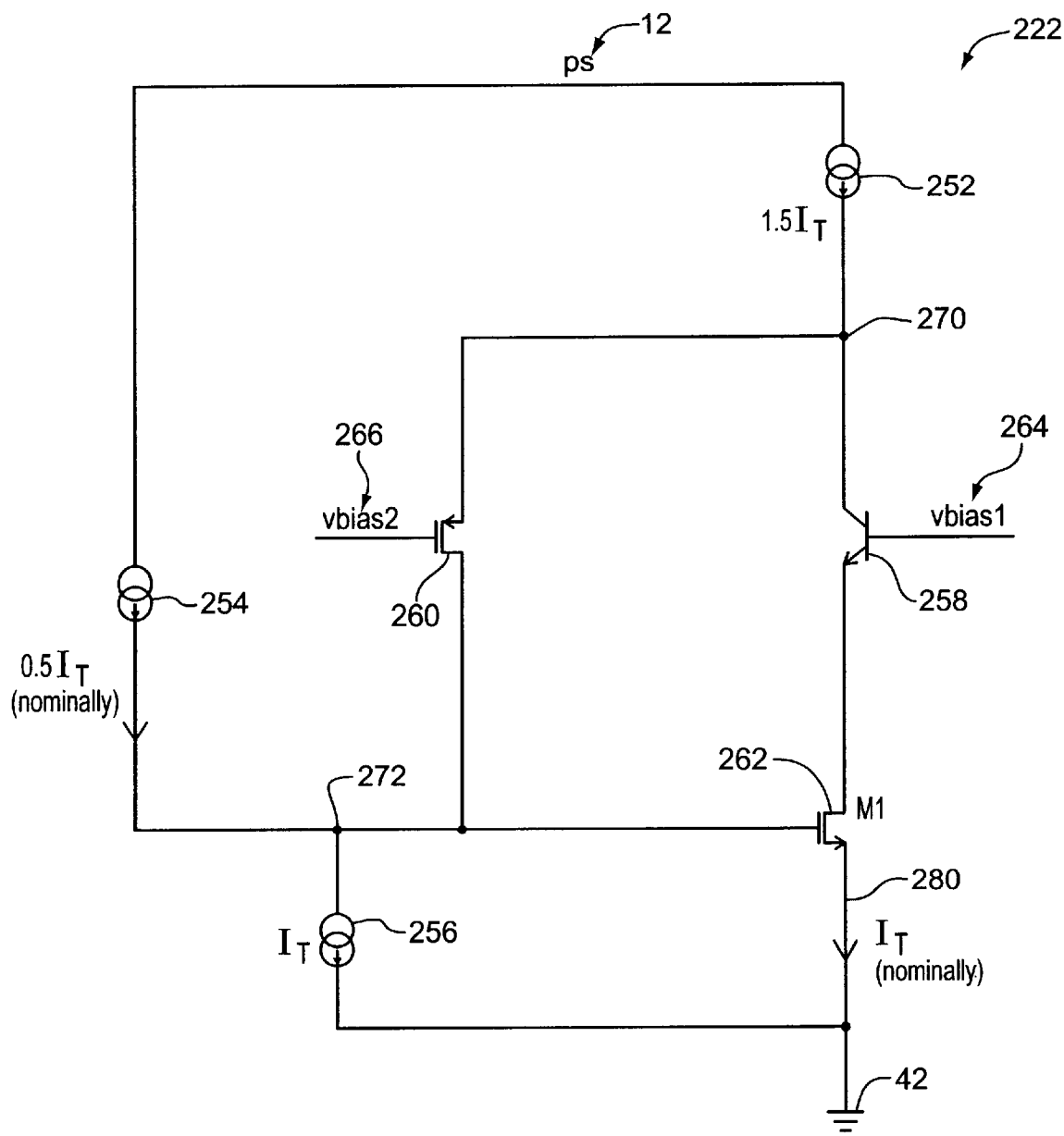
FIG. 5 is a circuit diagram of a supply independent biasing scheme with which the delay cell of FIG. 1 may be used.

FIG. 5 is a circuit diagram of a VCO supply independent biasing circuit, scheme, or block 222 with which the VCO 224 in the form of a multiple-stage differential ring oscillator comprising multiples of the delay cells 100, for example, may be used. The supply independent biasing scheme 222 overcomes several of the disadvantages of the conventional biasing schemes described above. In particular, the biasing scheme 222 provides a stable, supply independent biasing scheme with wide bandwidth and fast response.

As shown, the VCO biasing circuit 222 generally comprises first and second current sources 252, 254, a current drain 256, first and second current splitting devices 258, 260, and a replica device 262. Replica device 262 is preferably identical or at least similar in construct to a tail current device (not shown) for generating current of the delay stage tail current source 118 (shown in FIG. 1). If the tail current and the replica devices are MOS devices, the gate of the replica device 262 would be coupled to the gate of the tail current device such that the same gate voltage is applied to the two MOS devices. Alternatively, where the tail current and the replica devices are BJT devices, the base of the replica device 262 would be coupled to the base of the tail current device such that the same base voltage is applied to the two BJT devices.

In the embodiment shown, the first current splitting device 258 is a NPN BJT, the second current splitting device 260 is a PMOS transistor, and the replica device 262 is an NMOS transistor. Because the replica device 262 is an NMOS transistor, the tail current device of the delay stage is also an NMOS transistor. In particular, the first and second current sources 252, 254 are coupled between the power supply 12 and nodes 270, 272, respectively. The current drain 256 is coupled between nodes 272 and ground 42. The collector and emitter of the first current splitting device 258 is coupled to node 270 and drain of the replica device 262, respectively. The source and drain of the PMOS second current splitting device 260 is coupled to nodes 270, 272, respectively. The drain, gate, source of the replica device 262 are coupled to the emitter of the first current splitting device 258, node 272, and ground 42, respectively.

The first current source 252 preferably has a current of approximately (1.5*$I_T$) where $I_T$ represents the current of the tail current source. Current of the second current source 254 is generated by the transconductor Gm 220 and is a measure of the error signal generated by the PLL to correct the phase and frequency of the VCO 224 (as shown in FIG. 2) so as to maintain lock. Further, the current drain 256 preferably has a current of $I_T$. Thus, nominally, the current through the second current source 254 is approximately (0.5*$I_T$) such that the current through a tail current branch 280 is also nominally approximately $I_T$. Because the second current source 254 provides a current of approximately (0.5*$I_T$) to the current drain 256 and the current drain 256 draws or pulls a current of approximately IT, approximately (0.5*$I_T$) of current from the first current source 252 is drawn through the second current splitting device 260 to the current drain 256. A remaining current of approximately $I_T$ of the current (1.5*$I_T$) provided by the second current splitting device 260 flows through the first current splitting device 258 and the replica device 262.

When the error current through the second current source 254 as generated by the transconductor changes to, for example, (0.25*$I_T$), the current through the tail current branch 280 becomes (0.75*$I_T$), i.e., a change of (0.25*$I_T$) which is of equal magnitude as the change of the current through the second current source 254 from the nominal values, as desired.

The change in the current through the tail current branch 280 in response to change in current through the second current source 254 has a short response time and is quick settling as there are no additional poles in the biasing path. Thus, such changes in current would appear almost instantaneously with no or nearly no delay.

In addition to a quick response and settling of the tail current in response to changes in the current through the second current source 254 as generated by the transconductor, it is also desirable to maintain the current through the tail current branch 280 independent of variances in the power supply 12 in order to maintain a constant delay of the delay stage so as to maintain the frequency of the VCO, e.g., a ring oscillator, constant. The biasing scheme 222 provides such supply independent characteristic as described below.

The biasing scheme 222 provides a first voltage vbias1 264 at the base of the BJT 258 and a second voltage 266 at the gate of the PMOST device 260. The first voltage vbias1 264 is preferably biased relative to the power supply 12 such that any change in power supply 12 is tracked and appear on the drain of the NMOS replica device 262. Thus, the drain voltage of the NMOS device 262 tracks that of the NMOS tail current device. The second voltage vbias2 266 is also preferably biased relative to the power supply 12. In addition, through a regulation feedback loop formed by the BJT 258, the PMOS transistor 260, and the NMOS replica device 262, the biasing scheme 222 regulates the gate voltage of the NMOS replica device 262, i.e. voltage at node 272. Thus, with the drain and gate voltages of the NMOS replica device 262 tracked to the power supply 12, the desired biasing current, i.e., current through the tail current branch 280, is immune to the variations in the power supply 12. As is evident, the changes in currents are independent of power supply variations.

The biasing scheme 222 presents a wideband path to the error current 254 as the feedback regulation mechanism is itself high speed in nature. In particular, because the feedback loop is similar to a folded cascode structure and has a single pole formed at the gate of the NMOS replica device 262, i.e., the only high impedance node in the feedback loop, the feedback loop has a wider bandwidth and is inherently more stable than, for example, a structure with a two pole configuration.

Although one preferred embodiment is shown and described with the first and second current splitting devices 258, 260, and the replica device 262 as a BJT, a PMOS transistor, and an NMOS transistor, respectively, it is to be understood that an NMOS transistor may be utilized in place of the BJT 258 and/or that an PNP BJT may be utilized in place of the PMOS transistor 260, for example. Where an PNP BJT is utilized in place of the PMOS transistor 260, the emitter and collector nodes of the PNP BJT would be coupled to nodes 270 and 272, respectively. It is to be understood also that any other suitable combination of current splitting devices may be utilized. Further, as mentioned above, the replica device 262 is a device replicating the tail current device for generating current of the delay stage tail current source 118 (shown in FIG. 1).

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A biasing scheme for generating a bias electrical signal, comprising:
   a first and second current source coupled to a power supply;
   a current drain directly connected to said second current source and to ground wherein the current generated from said second current source is substantially equal to the current flow through said current drain;
   a replica device having a first, second, and third node, said second node being coupled to said second current source and to said current drain, said third node being coupled to ground, respectively; and
   a first and second current splitting device having first nodes coupled to each other and to said first current source and having third nodes coupled to said first and second nodes of said replica device, respectively.

2. The biasing scheme for generating a bias electrical signal of claim 1, wherein said first and second current splitting devices have second nodes coupled to a first and second bias voltage, respectively, said first and second bias voltages being biased relative to the power supply.

3. The biasing scheme for generating a bias electrical signal of claim 1, wherein said replica device is an NMOS transistor having drain, gate and source as first, second, and third nodes, respectively.

4. The biasing scheme for generating a bias electrical signal of claim 1, wherein said replica device is a bipolar junction transistor having collector, base, emitter as first, second, and third nodes, respectively.

5. The biasing scheme for generating a bias electrical signal of claim 1, wherein said first current splitting device is a NPN bipolar junction transistor having collector, base, emitter nodes as first, second, and third nodes, respectively.

6. The biasing scheme for generating a bias electrical signal of claim 1, wherein said first current splitting device is an NMOS transistor having drain, gate and source as first, second, and third nodes, respectively.

7. The biasing scheme for generating a bias electrical signal of claim 1, wherein said second current splitting device is a PMOS transistor having source gate and drain nodes as first, second, and third nodes, respectively.

8. The biasing scheme for generating a bias electrical signal of claim 1, wherein said second current splitting device is a PNP bipolar junction transistor having collector, base, emitter nodes as first, second, and third nodes, respectively.

9. The biasing scheme for generating a bias electrical signal of claim 1, wherein current through said first current source is approximately 1.5 times current through said current drain.

10. The biasing scheme for generating a bias electrical signal of claim 1, wherein said second current source is coupled to a transconductor.

11. The biasing scheme for generating a bias electrical signal of claim 1, wherein current through said second current source is approximately one-half of current through said current drain and current through a tail current branch extending from said third node of said replica device to the ground is nominally equal to current through said current drain.

12. The biasing scheme for generating a bias electrical signal of claim 1, wherein said second node of said replica device is coupled to a second node of another device of same construct as said replica device.

13. A method for generating a bias electrical signal, comprising:
    directing a first current of a first current source through at least a first and a second current splitting devices;
    directing current through said second current splitting device to a current drain;
    directing a second current from a second current source to the current drain wherein said second current source is directly connected to said current drain and wherein said current directed from said second current source is substantially equal to said current flowing through said current drain; and
    directing current through said first current splitting device to a replica device, said replica device being coupled to another device similar in construct as said replica device.

14. The method for generating a bias electrical signal according to claim 13, wherein said replica device is coupled to said current drain, said second current source, said first and second current splitting devices, and ground.

15. The method for generating a bias electrical signal according to claim 14, wherein each of said first and second current splitting devices is coupled to a first and second bias voltage, respectively, said first and second bias voltages being biased relative to a power supply.

16. A method for generating a bias electrical signal, comprising:
    supplying a first current from a first current source to a first and a second current splitting device;
    supplying a second current from a second current source, said second current source being coupled to a transconductor;
    drawing a drain current through a current drain from said second current source and from a second current splitting device wherein said second current source is directly connected to said current drain and wherein said drain current directed from said second current source is substantially equal to said drain current flowing through said current drain;
    directing at least a portion of said first current through a replica device coupled to said first and second current splitting devices, said second current source, said current drain, and ground.

17. The method for generating a bias electrical signal of claim 16, further comprising supplying a first and second bias voltage to said first and second current splitting devices, respectively, said first and second bias voltages being generated relative to a power supply.

* * * * *